United States Patent [19]

Knapp-Ziller et al.

[11] 4,136,288
[45] Jan. 23, 1979

[54] FREQUENCY TRANSLATION CIRCUITS

[75] Inventors: Michel Knapp-Ziller; Loic Pasquer, both of Paris, France

[73] Assignee: Societe Lignes Telegraphiques et Telephoniques, Paris, France

[21] Appl. No.: 795,142

[22] Filed: May 9, 1977

[30] Foreign Application Priority Data

May 11, 1976 [FR] France ................................ 76 14036
Oct. 20, 1976 [FR] France ................................ 76 31564

[51] Int. Cl.² .......................................... H03K 17/68
[52] U.S. Cl. .................................. 307/240; 307/208; 307/243; 307/251; 307/257
[58] Field of Search ............... 307/208, 240, 251, 255, 307/257, 243

[56] References Cited

U.S. PATENT DOCUMENTS

| 3,495,097 | 2/1970 | Abramson et al. ............... 307/240 X |
| 3,675,043 | 7/1972 | Bell ................................... 307/251 X |
| 3,705,313 | 12/1972 | Ohsawa ........................... 307/240 X |
| 3,845,328 | 10/1974 | Hollingsworth ................ 307/255 X |
| 3,989,955 | 11/1976 | Suzuki ............................. 307/208 X |

Primary Examiner—John S. Heyman
Attorney, Agent, or Firm—Kemon & Estabrook

[57] ABSTRACT

A frequency translator, for translating a signal at frequency f into the F−f and F+f bands where F is a carrier, consisting mainly of an integrated circuit comprising two bidirectional switches controlled by two 180° out of phase square signals at the carrier frequency, each switch being supplied from one output of a d.c. voltage source fed with said carrier equal respectively to the absolute maximum and minimum values of the square wave, said signal being applied to said bidirectional switches either directly or through a transformer. In a preferred embodiment the switches consist of a C-MOS integrated circuit.

6 Claims, 9 Drawing Figures

Prior art  FIG. 1
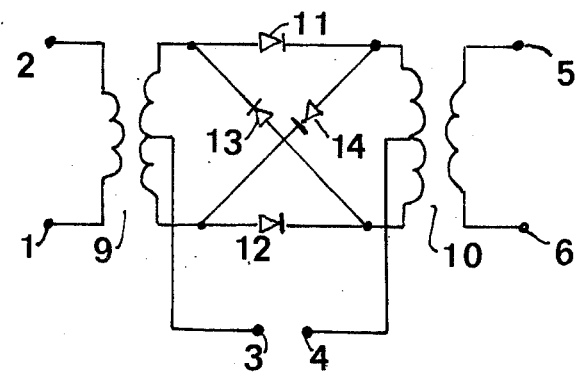
FIG. 2
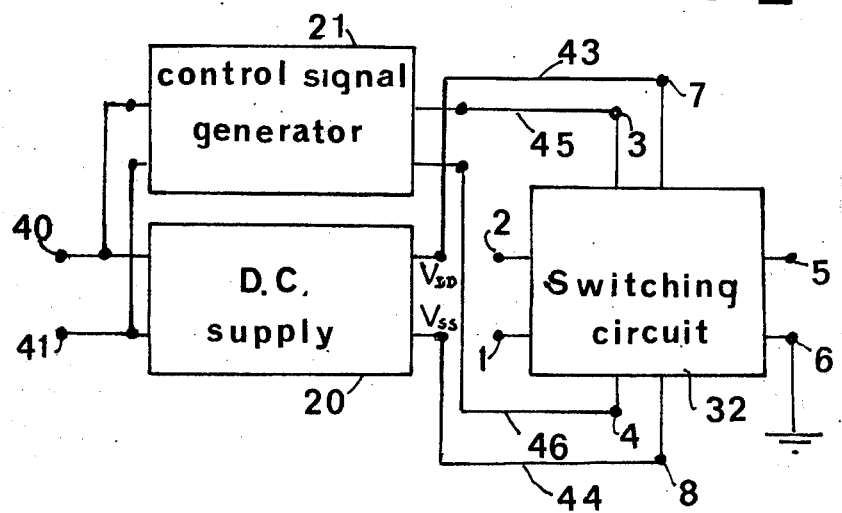

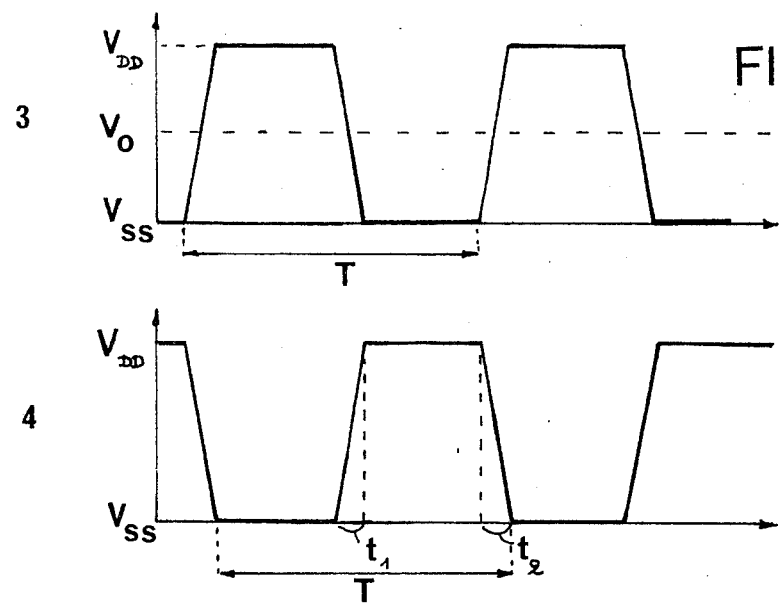
FIG. 3
FIG. 4
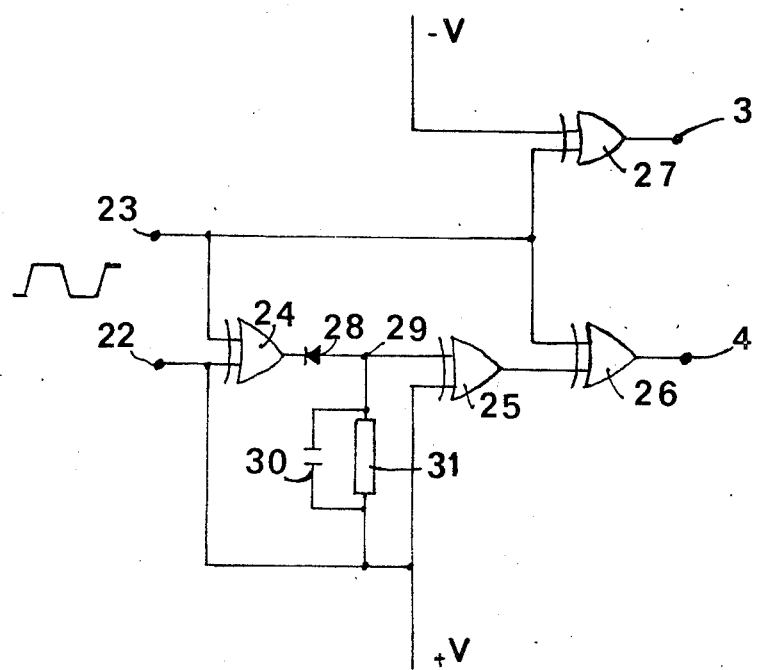

FREQUENCY TRANSLATION CIRCUITS

BACKGROUND OF THE INVENTION AND PRIOR ART

The invention concerns carrier-current telecommunications and more particularly frequency translation circuits operating with inversion modulation.

Such a circuit, which is described in French Pat. No. 739,103 filed on June 25th, 1932, by Societe d'Etudes pour Liaisons Telephoniques et Telegraphiques, is illustrated in FIG. 1. Between a first pair of terminals 1 and 2 and a second pair of terminals 5 and 6, the said circuit comprises two transformers 9 and 10 which are connected by the diodes 11, 12, 13 and 14. The transformers 9 and 10 each have a winding whose mid-point is connected respectively to one of the terminals 3 and 4 of a third pair of terminals. Two pairs of terminals are respectively fed with a carrier wave at frequency F and a signal at frequency f. The waves translated to the frequencies F−f and F+f respectively, which result from the inversion modulation, are picked up between the pair of terminals which has remained free. The quality of such a circuit depends essentially upon the couplings between the various pairs of terminals and the non-linear distortions which build up undesirable frequencies in the circuit. Reduction of the couplings involves balancing of the windings of the transformers as well as matching of the diodes. With regard to the non-linear distortion, it is a function both of the characteristics of the diodes and of the wave shape and the power level of the carrier wave. In practice, in carrier current systems utilizing this method of frequency transposition, the carrier wave power necessary to each channel is of the order of 300 microwatts and may reach 10 milliwatts when the number of channels to be translated rises to 900. Generally speaking, the oscillator at the frequency F of the carrier wave, which is common to a number of translation circuits, supplies insufficient power, so that an amplifier which raises the power of the carrier wave to the necessary value must be associated with each frequency translation circuit. The increasing capacity of analog multiplex equipments results in an increase in the number of translation circuits and of associated amplifiers and consequently leads to the use of a considerable supply power. Since the energy output of the circuits is low, an unacceptable temperature rise takes place in the equipment.

The present invention has for its object to provide a frequency translation circuit which requires a low carrier wave level, which results in a limitation of the necessary total power and consequently of the power dissipated in the form of heat by the frequency translation circuits in a communication system comprising a large number of channels.

BRIEF DISCLOSURE OF THE INVENTION

A frequency translation circuit according to the invention comprising a first pair of terminals connected to a carrier wave source, a second pair of terminals connected to a source of signals to be translated, a d.c. voltage supply whose two output terminals are at the potentials $V_{DD}$ and $V_{SS}$ respectively in relation to earth taken as reference potential, a pair of output terminals whose first terminal is connected to earth and whose second terminal is connected to an output conductor is provided with:

a control voltage generator whose input is connected to the said first pair of terminals, supplying at its two output terminals two square-wave control voltages out of phase by 180°, whose amplitudes are equal to the potential difference $(V_{DD} - V_{SS})$;

an integrated double bidirectional switch comprising:
a first electrode connected to the terminal at the potential $V_{DD}$ of the said d.c. supply;
a second electrode connected to the terminal at the potential $V_{SS}$ of the said d.c. supply;
a first control electrode connected to one of the output terminals of the said control signal generator;
a second control electrode connected to the other output terminal of the said control signal generator;
two pairs of switching electrodes each having one electrode insulated from one of the other pair and one electrode connected to one of the other pair.

In a first embodiment of the translation circuit according to the invention, the signal to be translated is applied between the reference potential and the switching electrodes of the said integrated circuit which are connected together, the switching electrodes which are insulated from one another being connected respectively to the two inputs of a differential amplifier whose output is connected to the output conductor.

In a second embodiment, the signal to be translated is applied between the reference potential and the input of an amplifier having symmetrical outputs which are connected respectively to the switching electrodes of the said circuit which are insulated from one another, the two switching electrodes which are connected together being connected to the output conductor.

In a third embodiment which is to be used for bidirectional circuits, the signal to be translated is applied to the primary winding of a transformer whose secondary winding has a mid-point connected to the reference potential and ends connected to the two switching electrodes of the said integrated circuit which are insulated from one another, the two switching electrodes which are connected together being connected to the output conductor.

The frequency translation circuit according to the invention has the following advantages:

It may be used for any frequency translation in a very wide range extending from the low frequencies to frequencies of the order of a number of megahertz.

The carrier wave power is independent of the level of the wave to be translated.

The total power necessary for the translation is greatly reduced as compared with that which is necessary to operate ring modulators according to the prior art.

The remote supply of the frequency translation circuits can be achieved by use of the energy of the carrier wave without any local energy supply.

When the carrier wave is received asymmetrically, the mid-point of the secondary winding of the input transformer for the signal to be translated is connected to the reference potential. This arrangement allows avoiding cumbersome decoupling capacitors.

The first two embodiments described which do not comprise any transformer lend themselves to integration and their overall dimensions are then reduced and the cost lowered.

The third embodiment described, in contrast to the prior art, does not require the same precision in the balancing of the windings of the transformer.

BRIEF DESCRIPTION OF THE FIGURES

Further features and advantages of the invention will become apparent in the course of the following description accompanied by FIGS. 1 to 9, which are given by way of illustration and have no limiting character, and in which:

FIG. 1 is the diagram of a frequency translation circuit according to the prior art, FIG. 2 is a block diagram of the frequency translation circuit according to the invention, FIG. 3 illustrates the laws of variation of the control voltages as a function of time, FIG. 4 is the circuit diagram of a phase shifter which can be used in the control signal generator.

DETAILED DISCLOSURE OF THE INVENTION

Figure 5:
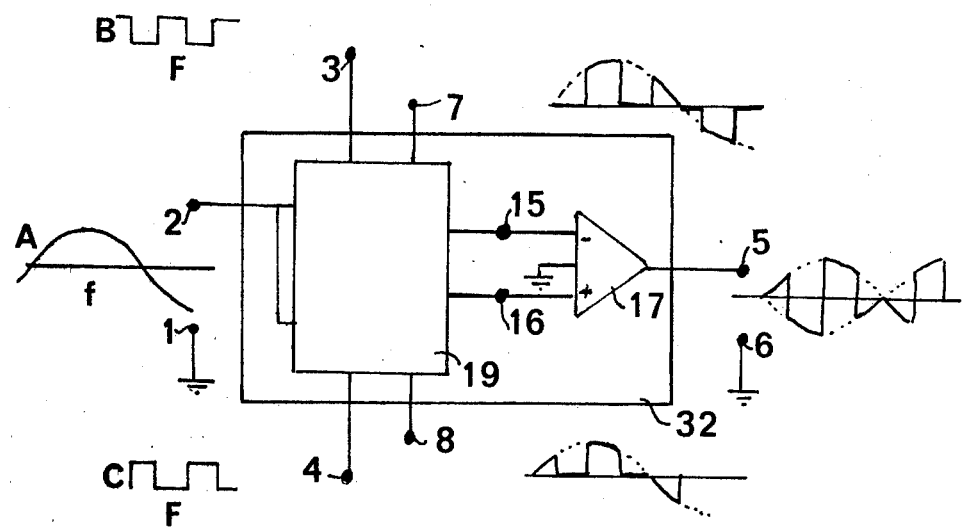
FIG. 5 illustrates a first embodiment of the switching circuit comprised in the frequency translation circuit according to the invention.

FIG. 1, which is the diagram of a frequency translation circuit according to the prior art, has been described in the foregoing.

FIG. 2 is a block circuit diagram of a frequency translation circuit according to the invention. In order to show the correspondence between the circuit illustrated in FIG. 1 and the translation circuit 32 of FIG. 2, some of the reference terminals which perform an equivalent function in the two circuits bear the same reference numerals. In FIG. 2, the terminals 1 and 2 are connected to a source of signals to be translated. The terminals 3 and 4 are connected to the control signal generator 21 by the leads 45 and 46 respectively. Terminals 5 and 6 deliver the translated signals at frequency F−f and F+f. The terminals 40 and 41 supplied by a carrier wave at frequency F are connected in parallel to the input of a d.c. supply 20 and to the input of the control signal generator 21. The output terminals of the d.c. supply 20, at the potentials $V_{DD}$ and $V_{SS}$ respectively, in relation to the reference potential, are connected to the electrodes 7 and 8 respectively of the switching circuit 32 by the conductors 43 and 44. The control voltages supplied at terminals 3 and 4 of the circuit 32 by the generator 21 are represented by the curves of FIG. 3 bearing the same reference numerals as the terminals to which they are applied. These two voltages are exactly 180° out of phase and the potentials reached at the levels and $V_{DD}$ and $V_{SS}$ respectively. In addition, the difference $(V_{DD} - V_{SS})$ must be greater than the operating threshold value $V_o$ corresponding to the type of circuit switching employed. When the latter is, for example, of the type marketed under the reference MC 14016 by MOTOROLA, or of the type marketed under the reference SFF 24016 by SESCOSEM, $V_o$ is equal to 2.9 volts. The voltage represented by the curves 3 and 4 in phase opposition have been generated in the generator 21 from a sinusoidal carrier wave of frequency F. The generator 21 comprises a limiting amplifier whose output is connected to the input of a phase shifter illustrated in FIG. 4. This circuit, which is referred to by way of example, meets the following requirements:

time of rise $t_1$ and time of fall $t_2$ of the signal such that their sum is lower than 5% of the period $T = 1/F$ ;

simultaneous maintenance at the value $V_{SS}$ of the voltages across the terminals 3 and 4 when the carrier wave at the frequency F disappears for the purpose of avoiding transmission of the signal to be translated.

FIG. 4 is the circuit diagram of a phase shifter intended to be connected by its input terminals 22 and 23 to a voltage amplifier which supplies a square wave and by its outputs to the terminals 3 and 4 of the circuit 32. This phase shifter has four "exclusive OR" gates 24, 25, 26, 27. The gate 24 is connected by its inputs to the input terminals 22 and 23 respectively of the phase shifter, of which the terminal 22 is maintained at a d.c. voltage + V. The output of gate 24 is connected through diode 28 to a first end 29 of a circuit composed of a capacitor 30 and of a resistor 31 and having a second end brought to the voltage + V. One of the inputs of the gate 25 is connected to the voltage + V and the other input is connected to the end 29 of the circuit composed of the resistor 31 and of the capacitor 30. The output of the gate 25 is connected to one of the inputs of the gate 26, while the second input of the gate 26 is connected to the input 23 of the phase shifter. The output of the gate 26 is connected to the terminal 4. In addition, the input 23 is connected to one of the inputs of the gate 27, while the second input of this gate is connected to a unidirectional voltage − V. The output of the gate 27 is connected to the terminal 3. When a square-wave voltage is applied between the terminals 22 and 23, there appear between the reference potential and the terminals 3 and 4 two voltages which vary in accordance with the curves 3 and 4 of the preceding figure. On the other hand, when no voltage is applied between the terminals 22 and 23 the terminals 3 and 4 are both maintained at voltage $V_{SS}$.

FIG. 5 is the diagram of a first embodiment of the circuit 32 of FIG. 2. This circuit comprises a C-MOS integrated circuit constituting two bidirectional switches 19 and a differential amplifier 17. The first of the said switches is connected on the one hand to the terminal 2 by one of its switching electrodes and on the other hand at 15 to one of the inputs of the amplifier 17 by the other one of its switching electrodes. The second switch is connected on the one hand to the terminal 2 by the first one of its switching electrodes and on the other hand at 16 to the second input of the amplifier 17 by the second one of its switching electrodes. The output of the amplifier is connected to the terminal 5 and the terminals 1 and 6 are connected to the reference potential. The integrated circuit 19 has two terminals referenced 3 and 4 which have already been mentioned in the foregoing and by means of which each switch can be independently controlled, and two terminals 7 and 8 connected to the d.c. supply 20 respectively at potentials $V_{DD}$ and $V_{SS}$.

Figure 6:
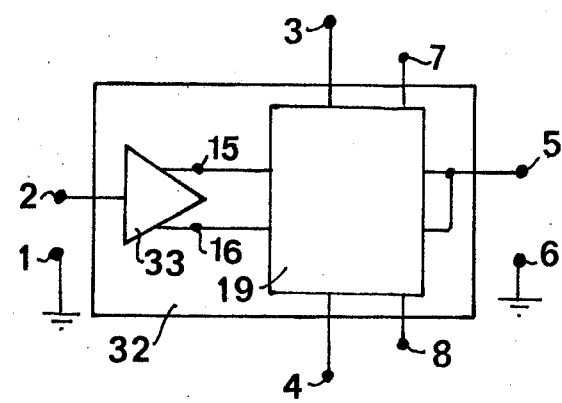
FIG. 6 illustrates a second embodiment of the switching circuit comprised in the frequency translation circuit according to the invention.

FIG. 6 is the diagram of a second embodiment of the circuit 32 of FIG. 2. This diagram comprises an integrated circuit 19 identical to that just described and an amplifier 33 having symmetrical outputs. Amplifier 33 is connected by its input to terminal 2 and by its output terminals to a respective first switching electrode of each of the switches of integrated circuit 19. Terminal 5 is connected to the second switching electrodes of each of the switches of integrated circuit 19. Terminals 1 and 6 are connected to the reference potential.

Figure 7:
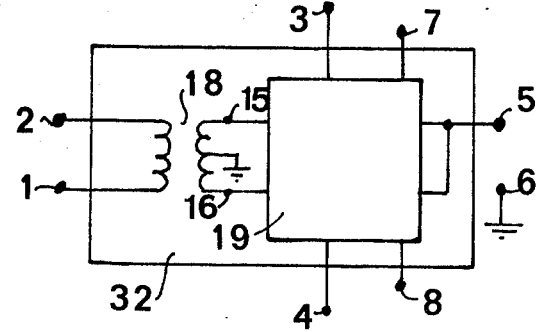
FIG. 7 illustrates a third embodiment of the switching circuit comprised in the frequency translation circuit according to the invention, and FIGS. 8 and 9 each illustrate a translation circuit for a group of telephone channels.

FIG. 7 is the diagram of a third embodiment of the circuit 32 of FIG. 2. This diagram differs from the preceding ones by the use of a transformer 18 instead of an amplifier. The primary winding of the transformer 18 is connected to terminals 1 and 2. The secondary winding of transformer 18 has a mid-point connected to the reference potential. The ends of the secondary winding of the transformer 18 are connected at 15 and 16 respectively to a first switching electrode of each of the switches of the integrated circuit 19. Terminal 5 is connected to the second switching electrode of each of the switches of integrated circuit 19. Terminal 6 is connected to the reference potential. The circuit illustrated in FIG. 6 is bidirectional like that of the prior art without requiring any careful balancing of the two half-windings of the transformer, so that the use of a transformer is a simple solution when either the input or the output of the translation circuit is to be balanced in relation to the reference potential.

The operation of the frequency translation circuit will be explained with reference to the wave forms illustrated in FIG. 5. There is shown at A a sinusoidal signal at frequency f as applied between the terminals 1 and 2 and two signals in the form of oscillations of period 1/F respectively in phase opposition at B and C. When the voltage applied to terminal 3 is equal to the supply voltage $V_{DD}$, the resistance of the switch between 2 and 15 is minimum, for example it has a value equal to 300 ohms. On the other hand, when terminal 3 is brought to the voltage $V_{SS}$ the resistance of the switch between 2 and 15 is maximum and reaches, for example, $10^{11}$ ohms. Similarly, the resistance of the switch connected at 2 and 16 varies between the maximum value and the minimum value with a time difference equal to a half-cycle of the carrier frequency F.

The use of a double switch C-MOS integrated circuit is particularly advantageous in that the current necessary to control the switches is very low and does not depend upon the level of the carrier wave. Amplifier 17 receives at its two inputs two voltages of opposite signs as illustrated in FIG. 5 opposite 15 and 16. One of them is zero during a half-cycle of the carrier wave, while the other varies as the signal to be translated, and conversely during the succeeding half-cycle the first varies as the signal to be translated while the second is zero. Between the terminals 5 and 6 a wave modulated on either side of its mean value and having the frequencies $F-f$ and $F+f$ is built up.

The operation of the circuit illustrated in FIG. 6 closely resembles that just described. Amplifier 33 separately supplies two voltages which are equal and of different sign with respect to the reference potential. Circuit 19 samples these two voltages at the frequency F and transmits the sampled values to the terminal 5 in turn. Between terminals 5 and 6 a modulated wave identical to that supplied by the translation circuit illustrated in FIG. 5 is built up.

The operation of the circuit illustrated in FIG. 7 is identical to that illustrated in FIG. 6.

By way of non-limiting illustration, the frequency translation circuit illustrated in FIG. 5 was designed with two bidirectional switches belonging to the same integrated circuit referenced MC 14016 and a differential amplifier referenced HA 2525. The carrier frequency F is equal to 500 KHz and the signal frequency is equal to 100 KHz. The phase shifter illustrated in FIG. 4. consisted of an integrated circuit 4030 comprising four "exclusive-OR" gates, a diode 1N 4148, a resistor 31 having a value equal to $10^5$ ohms and a capacitor 30 having a capacitance equal to 0.1 microfarad. With a supply voltage V equal to 5 volts, the voltages supplied at the terminals 3 and 4 are variable between $V_{SS} = 0$ and $V_{DD} = 5$ volts with a frequency equal to that of the carrier wave at very low supply power. For example when there is added on the input side of the phase shifter an integrated circuit of type 4007 comprising three amplifiers operated in series, the total consumption of the amplifier, of the phase shifter and of the frequency translation circuit is lower than 2 milliamperes. The whole circuit translates a signal having a power equal to $10^{-6}$ watt, introducing an intermodulation noise lower than $5 \cdot 10^{-12}$ watt. The power of the carrier wave necessary for the operation of the frequency translation circuit is of the order of magnitude of one microwatt and permits translation of a large number of channels. Indeed, the signal to be translated may be a complex signal having a large number of channels without modification of the operation of the circuit. The circuit illustrated in FIG. 6 was designed with a balanced output amplifier of the type marketed under the reference CA 3001 by RADIO CORPORATION OF AMERICA, and two switches forming part of the switching circuit are a circuit referenced MC 14016, as already mentioned. The whole arrangement consisting of the circuit illustrated in FIG. 6, the phase shifter illustrated in FIG. 4 and the circuit 4007 requires for operation a carrier wave power identical to that of the circuit of FIG. 5, and a d.c. supply of substantially the same power.

Figure 8:
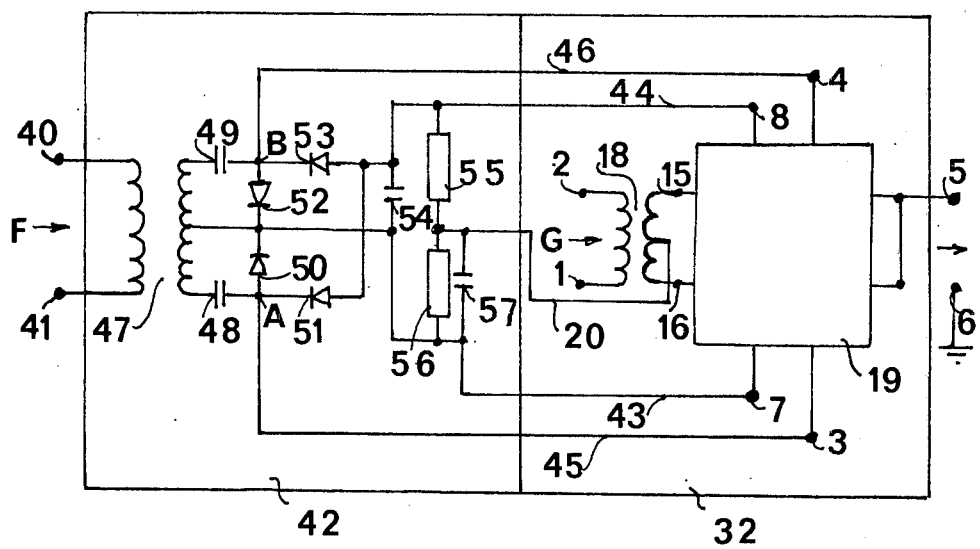
Figure 9:
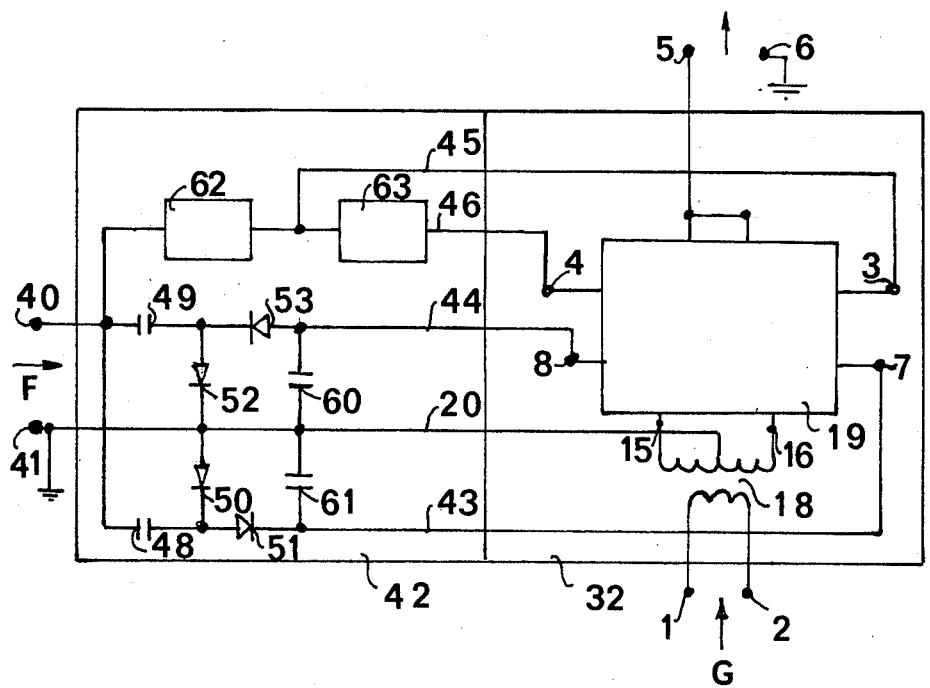

FIGS. 8 and 9 relate to the application of the invention to the translation of a group of G telephone channels. The group of channels is fed between the terminals 1 and 2, while the carrier wave at frequency F and of amplitude $U_c$ is applied between the terminals 40 and 41. The carrier wave is assumed to be in the form of a square wave of period $T = 1/F$, wherein the time of rise $t_1$ and the time of fall $t_2$ of the edges have a sum lower than 0.1 T, as already stated with reference to the control voltages. In these figures, the d.c. supply 20 and the control signal generator 21 have been grouped within the rectangle 42.

The supply of the circuit of FIG. 8 comprises an input transformer 47, in which the ratio of the number of turns $2n_2$ of the secondary winding to the number of turns $n_1$ of the primary winding is chosen as a function of the level supplied by the source of the carrier wave and its impedance. The ends of the secondary winding of the transformer 47 are connected by means of the capacitors 48 and 49 to the mid-points A and B respectively of the two diode bridges 50 and 51 on the one hand, and 52 and 53 on the other hand. The anodes of diodes 51 and 53 are connected together and form one of the terminals of the d.c. supply. The cathodes of the diodes 50 and 52 are connected together, as well as to the mid-point of the secondary winding of the transformer 47 and constitute the other terminal. A filtering capacitor 54 has its electrodes connected to the respective terminals of the supply. The points A and B are connected to the points 3 and 4 respectively of the switching circuit by the leads 45 and 46. A potential dividing bridge consisting of the resistors 55 and 56 is connected to the terminals of the supply and to the terminals 7 and 8 of the switching circuit 19 by leads 43 and 44. The common point of the resistors 55 and 56 of equal values is connected by the lead 20 to the midpoint of the secondary winding of transformer 18, because the amplitude of the signals translated without distortion is maximum when the inputs 15 and 16 are brought to voltages balanced about V/2. A decoupling capacitor 57 is connected in parallel with resistor 56.

The circuit illustrated in FIG. 8 operates as follows: the two diode bridges and the capacitors 48, 49 and 54 form a full-wave voltage-doubler rectifier which charges capacitor 54 at a voltage V equal to $(2n_2/n_1)$ $(U_c-V_d)$, $V_d$ being the voltage drop per diode at the current supplied by integrated circuit 19. In addition, capacitors 48 and 49 transmit to the points A and B two square-wave voltages 180° out of phase with an amplitude equal to $n_2/n_1 U_c$ with a d.c. component equal to half of the rectiefied voltage appearing at the terminals of the capacitor 54. Since the consumption of the electrodes 3 and 4 of the integrated circuit 19 is not measurable, the control of integrated circuit 19 is effected, without any disadvantage in the operation of the rectifier, by connecting the point A to the input 3 and the point B to the input 4, since the inputs 3 and 4 are alternatively brought, in phase opposition, to the voltage of the input 1 and then to that of the input 8.

As a non-limiting illustrative example, a circuit comprising two bidirectional switches of the type MC 14016 was supplied from a carrier wave at a frequency equal to 120 KHz in square wave, applied to the input of the transformer 47, with an amplitude $U_c$ equal to 1.4 volt, the sum of the leading and trailing edges $t_1$ and $t_2$ of the square wave is close to 0.1 microsecond.

Transformer 45 has a ratio $n_2/n_1 = $ '($n_2$ being the number of turns of a half-secondary winding).

Transformer 18 has a ratio $n'_2/n'_1 = 4.1$ ($n'_2$ being the number of turns of a half-secondary winding).

In FIG. 9, one of the terminals 40 and 41 of the circuit 42 is connected to the reference potential. The same reference numerals have been employed for the elements already present in FIG. 8. However, diodes 50 and 51 are not connected as in FIG. 8, so that capacitor 60 connected between the anode of the diode 53 and the reference potential is charged at the volta ge $- 2U_c$, while the capacitor 61 connected between the reference potential and the cathode of the diode 51 is charged at the voltage $+ 2U_c$. This arrangement makes it possible to connect the mid-point of the secondary winding of the transformer 18 to the reference potential, while maintaining the possibility of transmitting signals whose peak-to-peak amplitude is equal to V. In addition, the carrier wave is introduced into a C-MOS circuit 62 performing the function of an amplifier, and then inverted in a second circuit 63 identical to the preceding one, so that the voltages available on the input and output sides of the circuit 63 appropriate for the control of integrated circuit 19 are applied to the electrodes 3 and 4 of the latter through leads 45 and 46.

By way of illustration, the circuit arrangement of FIG. 9 was designed with one-third of an integrated circuit MC 14007, marketed by MOTOROLA, to form the amplifier 62 and one-third of a circuit MC 14007 to form the inverter 63 of FIG. 9.

What we claim is:
1. A frequency translation circuit comprising:
   a dc supply having input and output terminals;
   a control signal generator, having input and output terminals, for delivering two square waves 180° out of phase;
   means for connecting a carrier wave to a parallel connection of the input terminals of said supply and generator;
   a switching circuit including a C-MOS double bi-directional switch having a pair of output terminals for delivering the translated signal and first, second and third pairs of input terminals connected respectively to the signal to be frequency translated, to the output terminals of said control signal generator and to the output terminals of said dc supply.

2. A frequency translation circuit according to claim 8 in which said switching circuit includes a differential amplifier, means to interconnect said switch and said amplifier and means connecting the output of said amplifier to one of said pair of output terminals.

3. A frequency translation circuit according to claim 8 in which said switching circuit includes: an amplifier with balanced outputs, means to interconnect said switch and said amplifier, means connecting one of said first pair of input terminals to said amplifier and means connecting said bi-directional switch with one of said output terminals.

4. A frequency translation circuit according to claim 1 in which said switching circuit includes: a transformer having an earthed midpoint secondary winding, means connecting the primary winding of said transformer to said first pair of input terminals, means connecting the ends of said secondary winding to said bi-directional switch, and means connecting said bi-directional switch with one of said output terminals.

5. A frequency translation circuit for a group of telephone channels comprising:
   a dc supply which is a voltage doubler having a diode bridge;
   a first transformer having its secondary connected to said bridge and its primary being supplied with a square wave carrier;
   a switching circuit including a C-MOS double bi-directional switch having first, second and third pairs of input terminals;
   a second transformer having a center tapped secondary connected to fit first input terminals;
   a center tapped voltage divider connected across the output of said voltage doubler;
   means connecting the center tap of said voltage divider to the center tap of said second transformer;
   said second and third input terminals of said switching circuit being connected respectively to the output of said voltage doubler and opposite sides of said diode bridge, and the primary of said second transformer being connected to a group of telephone channels to be translated, said switching circuit having an output which is the translated signal.

6. A frequency translation circuit for a group of telephone channels comprising:
   a dc supply which is a voltage doubler having a diode bridge with its reference point connected to ground;
   a switching circuit including a C-MOS double bi-directional switch having first, second and third pairs of input terminals;
   a transformer having a center tapped secondary winding connected to said first pair of input terminals, the center tap connected to the reference point of said bridge and the primary winding connected to a group of telephone channels to be translated;

means coupling a square wave carrier between ground and one side of said bridge;
first and second amplifying circuits connected in series;
means supplying the carrier wave to the input of said first amplifier;

means connecting second pair of input terminals across said second amplifier;
means connecting said third set of input terminals across said diode bridge; and
said switching circuit having an output for the translated signal.

* * * * *